United States Patent [19]
Kim et al.

[11] Patent Number: 5,604,541
[45] Date of Patent: Feb. 18, 1997

[54] HIGH DEFINITION TELEVISION RECEIVER

[75] Inventors: Dae-Jin Kim; Key H. Kim; Hee B. Park; Jong S. Park, all of Kyungki-do; Yung G. Kim, Seoul, all of Rep. of Korea

[73] Assignee: LG Electronics Inc., Seoul, Rep. of Korea

[21] Appl. No.: 556,004

[22] Filed: Nov. 13, 1995

[30] Foreign Application Priority Data

Nov. 14, 1994 [KR] Rep. of Korea .................. 29837/1994

[51] Int. Cl.⁶ .................................................. H04N 7/015
[52] U.S. Cl. ........................ 348/426; 348/726; 348/538; 375/355; 375/371
[58] Field of Search ................................. 348/426, 726, 348/731, 735, 536, 537, 538, 392, 424; 375/316, 341, 355, 359, 371, 376; H04N 7/015; H03L 7/00

[56] References Cited

U.S. PATENT DOCUMENTS

| | | | |
|---|---|---|---|
| 4,503,453 | 3/1985 | Rougeolle ............................. | 348/538 |
| 5,363,408 | 11/1994 | Polk et al. ............................. | 375/341 |
| 5,425,060 | 6/1995 | Roberts et al. ........................ | 375/371 |
| 5,479,449 | 12/1995 | Patel et al. ............................ | 375/316 |
| 5,535,252 | 7/1996 | Kokayashi ............................. | 375/355 |

OTHER PUBLICATIONS

"VSB Transmission System", Zenith Electronics Corporation, Dec. 17, 1993, pp. 8–16, FIGS. 9, 12, 14.

*Primary Examiner*—Victor R. Kostak
*Assistant Examiner*—Jeffrey S. Murrell
*Attorney, Agent, or Firm*—Fish & Richardson PC.

[57] ABSTRACT

A HDTV receiver which is improved in its overall performance and is simplified in its configuration, by improving a symbol timing restoring circuit, includes a tuner for selecting a necessary channel from input signals via an antenna, an IF processing & carrier restoring portion for performing an IF process & carrier restoration from the output of the tuner, an analog-to-digital converter (ADC) for converting the output of the IF processing & carrier restoring portion into a digital signal, a timing restoring portion for restoring a timing from the output of the ADC, a 2:1 down-sampler for 2:1 down-sampling the output of the ADC, a sync detector for detecting a sync from the output of the 2:1 down-sampler, a channel equalizer for performing a channel equalization from the output of the 2:1 down-sampler, a phase controller for correcting the phase error from the output of the channel equalizer, an optimal viterbi decoder for performing a viterbi decoding operation from the output of the phase controller, a deinterleaver for dissipating the output of the optimal viterbi decoder in order to enhance the correction capability due to burst errors, an error controller for performing a Reed-Solomon decoding operation with respect to the output of the deinterleaver, and a derandomizer for releasing the output of the error controller and restoring a signal randomly formed at a transmission port reversely.

3 Claims, 4 Drawing Sheets

FIG.2 prior art
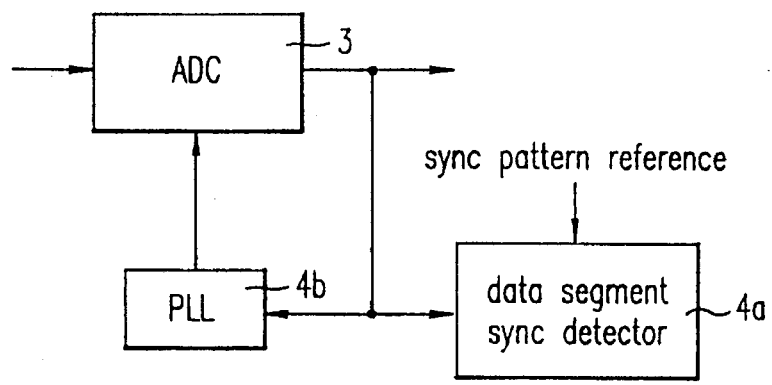
FIG.3A prior art
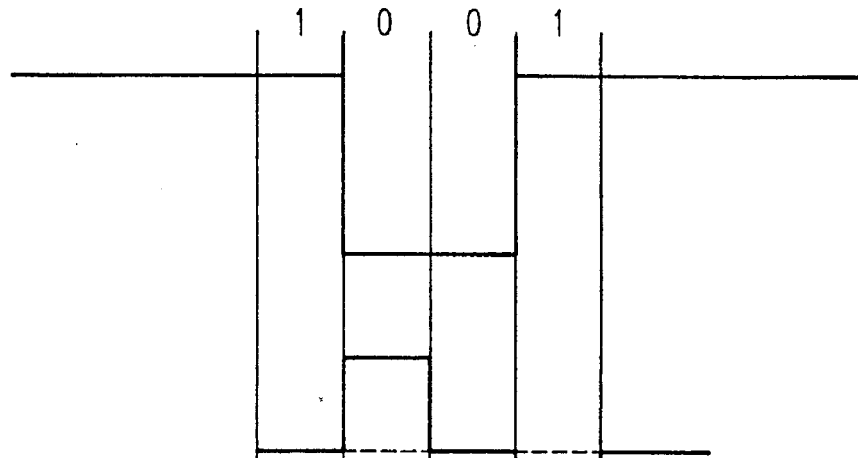
FIG.3B prior art
FIG.3C prior art
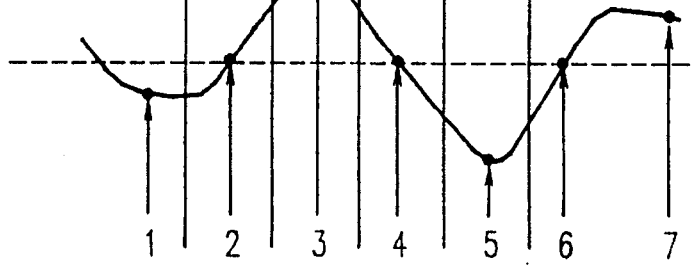

HIGH DEFINITION TELEVISION RECEIVER

BACKGROUND OF THE INVENTION

The present invention relates to a high definition television (HDTV) receiver, and more particularly, to a HDTV receiver which is improved in its overall performance and is simplified in its configuration, by improving a symbol timing restoring circuit.

FIG. 1 is a block diagram of a conventional 8-vestigial sideband (VSB) receiver, in which a high-frequency signal input from an antenna (ANT) is demodulated and is carrier-restored when a channel is selected in a tuner 1 and a signal having a central frequency of 44 MHz is automatic-gain controlled and IF-bandpass filtered in an IF processor & carrier restoring portion 2.

This signal is digitally sampled in an analog-to-digital conventer (ADC) 3 and precise symbol timing is detected by a timing restoring portion 4, thereby controlling the timing of ADC 3.

The output of ADC 3 is also input to a sync detector 5 to detect a data segment sync from a data segment sync pattern (FIG. 3A) and to detect a field sync from a field sync pattern being in the first line of a transmission format.

At this time, the data segment sync and field sync detected in sync detector 5 are used as the control signals of subsequent blocks 7 through 16.

NTSC (National Television System Committee) interference detector 7 receives a signal passing through a post-comb filter 6 and a signal not passing therethrough and determines whether there is an identical channel interference with that of NTSC or not, to then transmit a comb control signal SC1.

If there is no NTSC identical channel interference, the signal not passing through post-comb filter 6 is selected by a multiplexer 8. A channel equalizer 9 equalizes the incoming signal which is set to 8 levels to remove the intersymbol interference due to a ghost generated at the channel.

Also, a phase corrector 10 corrects the phase error remaining after signal-processing, setting the incoming signal to 8 levels. An optimal viterbi decoder 11 performs a 4-state viterbi decoding operation and the decoded output is output through multiplexer 13.

If there is NTSC identical channel interference, the output of post-comb filter 6 is selected as the output of multiplexer 8. At this time, post-comb filter 6 subtracts data delayed for 12 symbol period from the current data.

Therefore, the original 8 level data becomes 15 level data. The NTSC identical channel interference is removed. At this time, channel equalizer 9 and phase controller 10 operate assuming that the incoming signal is 15 level data, and multiplexer 13 selects and outputs the output of a partial response (PR) viterbi decoder 12.

PR viterbi decoder 12, an 8-state decoder, has much more complex structure than that of optimal viterbi decoder 11.

The output of multiplexer 13 is dissipated in order to enhance the correction capability for burst errors in a deinterleaver 14. An error controller 15 performs a Reed-Solomon decoding operation.

Also, a derandomizer 16 releases a signal randomly formed in a transmission port reversely. Timing restoring portion 4 is constituted by a data segment sync detector 4a and a phase locked loop (PLL) 4b, as shown in FIG. 2. The digitally converted signal is concurrently output to data segment sync detector 4a and PLL 4b.

At this time, data segment sync detector 4a detects a data segment sync, based on the data pattern "1001" for 4 symbol period of 2 levels shown in FIG. 3A.

PLL 4b detects the phase error for the timing from a data segment sync pattern. The output of a phase detector is as shown as FIG. 3B, digitally, and as FIG. 3C, analogically.

The position of a sampling point 4 shown in FIG. 3C is a zero-crossing point, and a symbol timing is detected using the zero-crossing point.

However, the aforementioned conventional art adopting a post-comb filter for reducing the NTSC identical channel interference has a very complex configuration.

SUMMARY OF THE INVENTION

To solve these problems, it is an object of the present invention to provide a HDTV receiver, which allows a better symbol timing restoration even if there is an NTSC identical channel interference, by improving a symbol timing restoring circuit, and which is simplified in its configuration, by eliminating a post-comb filter.

To accomplish the above object, there is provided a HDTV receiver comprising: a tuner for selecting a necessary channel from input signals via an antenna; an IF processing & carrier restoring portion for performing an IF process & carrier restoration from the output of the tuner; an analog-to-digital converter (ADC) for converting the output of the IF processing & carrier restoring portion into a digital signal; a timing restoring portion for restoring a timing from the output of the ADC; a 2:1 down-sampler for 2:1 down-sampling the output of the ADC; a sync detector for detecting a sync from the output of the 2:1 down-sampler; a channel equalizer for performing a channel equalization from the output of the 2:1 down-sampler; a phase controller for correcting the phase error from the output of the channel equalizer; an optimal viterbi decoder for performing a viterbi decoding operation from the output of the phase controller; a deinterleaver for dissipating the output of the optimal viterbi decoder in order to enhance the correction capability due to burst errors; an error controller for performing a Reed-Solomon decoding operation with respect to the output of the deinterleaver; and a derandomizer for releasing the output of the error controller and restoring a signal randomly formed at a transmission port reversely.

BRIEF DESCRIPTION OF THE DRAWINGS

The above objects and advantages of the present invention will become more apparent by describing in detail a preferred embodiment thereof with reference to the attached drawings in which:

FIG. 2 is a detailed block diagram of a timing restoring portion shown in FIG. 1;

FIGS. 3A through 3C are timing charts shown in FIG. 2;

DETAILED DESCRIPTION OF THE INVENTION

Figure 1:
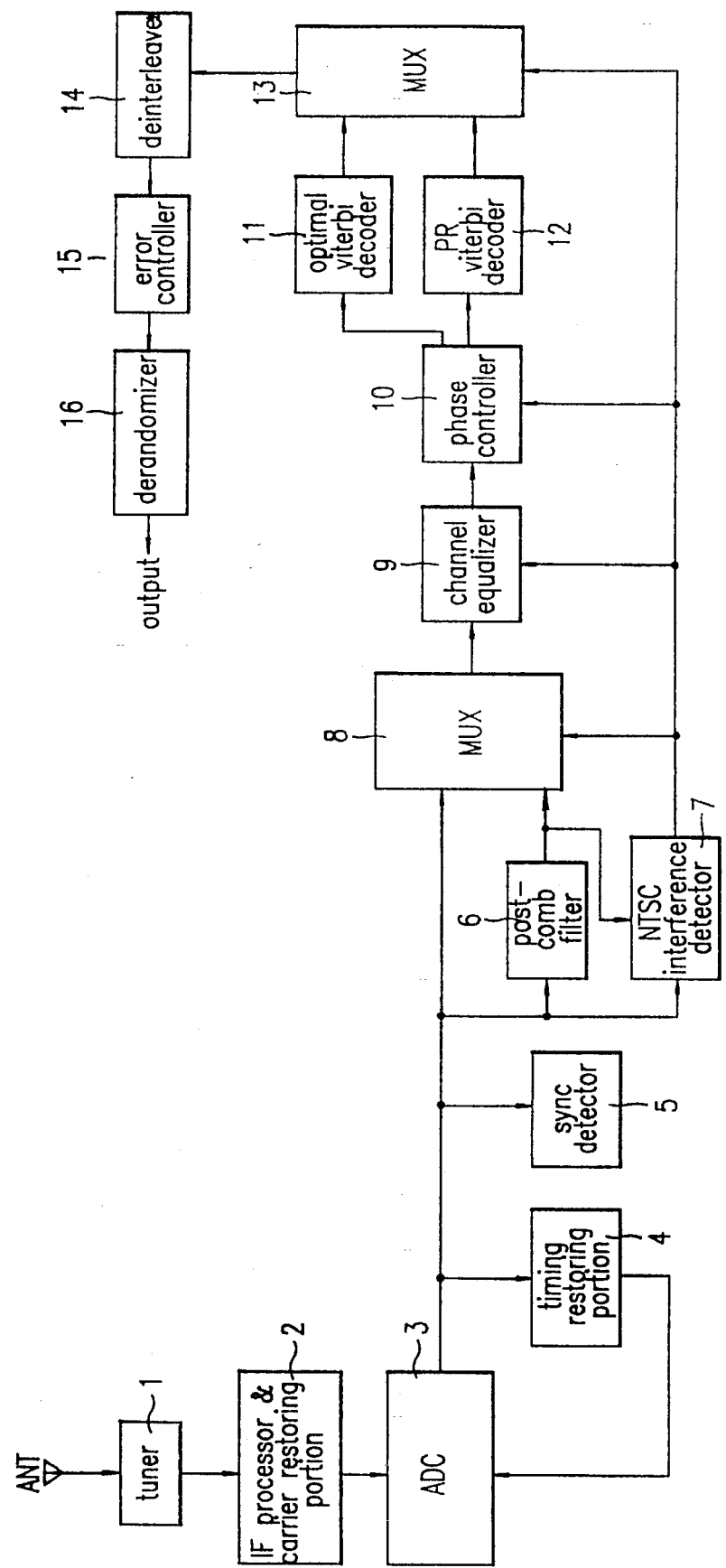
FIG. 1 is a block diagram of a conventional HDTV receiver.
Figure 4:
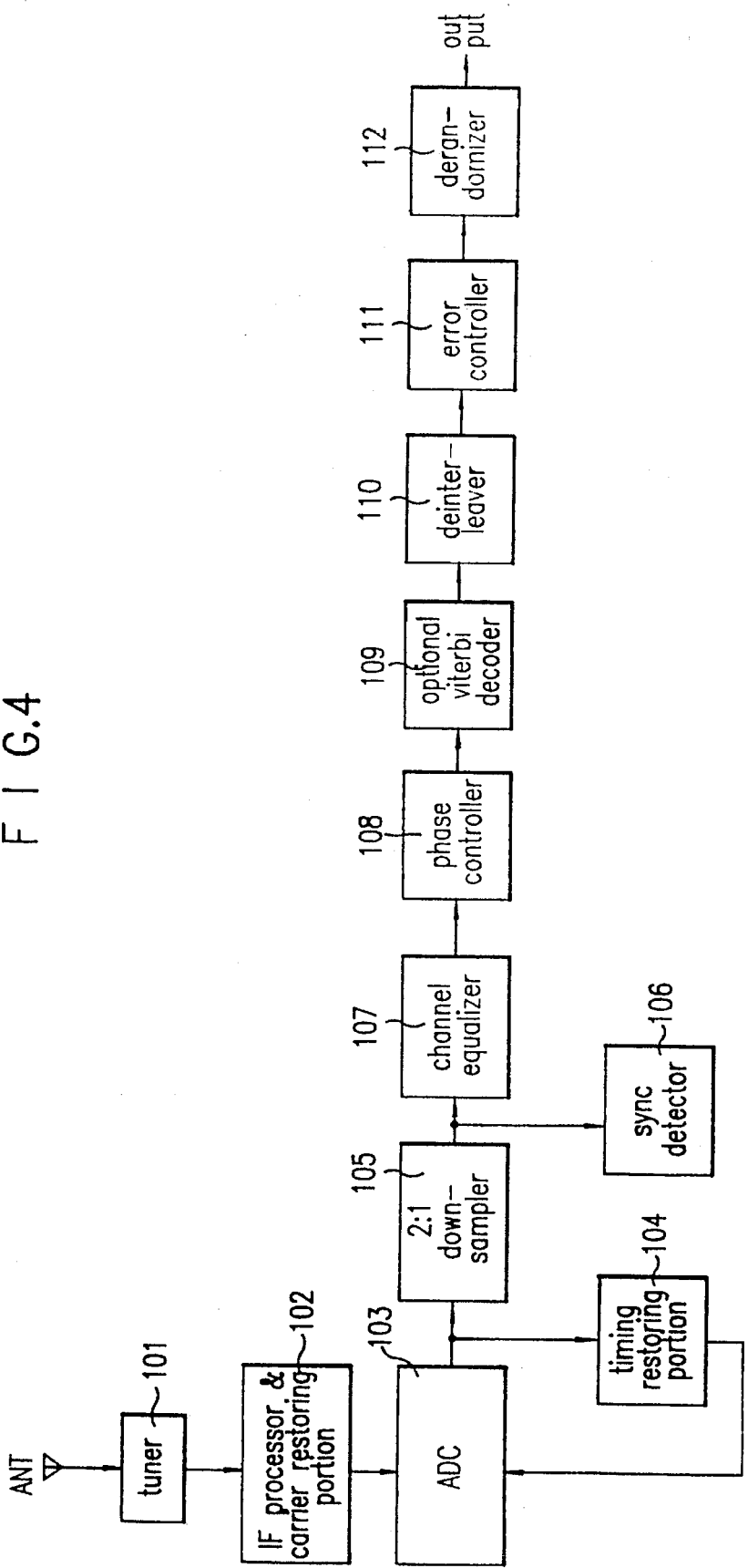
FIG. 4 is a block diagram of a HDTV receiver according to the present invention.

As shown in FIG. 4, the HDTV receiver according to the present invention has a simpler configuration than the conventional system in that post-comb filter 6, NTSC interference detector 7, multiplexer 8, PR viterbi decoder 12 and multiplexer 13 are eliminated from the conventional one. Channel equalizer 9 and phase corrector 10 of the convention system correspond to channel equalizer 107 and phase controller 108 of the present invention, respectively. Timing restoring portion 4 of the convention system corresponds to a new timing restoring portion 104 of the present invention, so that a symbol timing restoration is performed well even in the case of the NTSC identical channel interference.

Figure 5:
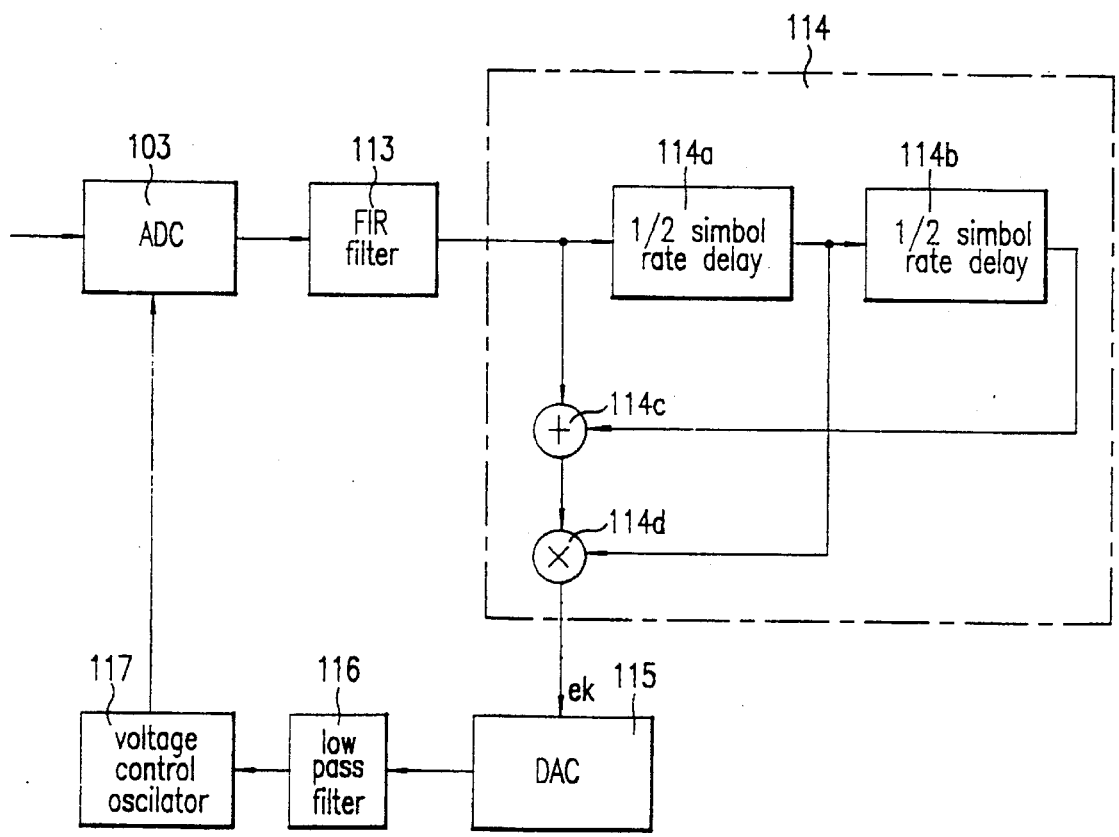
FIG. 5 is a detailed block diagram of a timing restoring portion shown in FIG. 4.

As shown in FIG. 5, timing restoring portion 104 includes an FIR filter 113 for filtering only the signal of a necessary symbol rate among the signals passing through ADC 103, a phase error detector 114 for detecting an phase error (ek) from the output of FIR filter 113, a digital-to-analog converter (DAC) 115 for converting again the output of phase error detector 114 into an analog signal, a lowpass filter 116 for lowpass-filtering the output of DAC 115, and a voltage controlled oscillator 117 for varying an oscillated frequency according to the output of lowpass filter 116 to supply a signal required in ADC 103.

At this time, phase error detector 114 is constituted by ½ symbol rate delays 114a and 114b for delaying the output of FIR filter 113 by ½ symbol rate, an adder 114c for adding the output of FIR filter 113 with the output of ½ symbol rate delay 114b, and a multiplier 114d for multiplying the output of adder 114c with the output of ½ symbol rate delay 114a to output a phase error (ek).

In the present invention having the aforementioned configuration, the operation of a tuner 101 and an IF processing & carrier restoring portion is the same as that of the conventional art. ADC 103 uses a clock of 21.52 MHz for over-sampling twice the symbol rate with a sampling clock, which is because the data twice over-sampled is required in timing restoring portion 104.

The signal restored from timing restoring portion 104 is directly supplied to 2:1 down-sampler 105, and 2:1 down-sampler 105 samples only the data of a desired symbol rate. A sync detector 106 detects a data segment sync and a data field sync.

A channel equalizer 107 to which only 8 level data is applied equalizes in accordance therewith. Also, phase controller 108 and optimal viterbi decoder 109 to which only 8 level data are applied, operate irrespective of 15 level data.

The operations of deinterleaver 110, error controller 111 and derandomizer 112 will be omitted here, since the respective elements operate in the same manner as that of the corresponding elements of the conventional system.

The signal passing through ADC 103 undergoes a bandpass filtering operation of central 5.38 MHz (=½T, here, 1/T is symbol rate) in FIR filter 113 of timing restoring portion 104.

The output of FIR filter 113 is delayed in ½ symbol rate delays 114a and 114b by ½ symbol rate. The output of ½ symbol rate delay 114b and the output of FIR filter 113 is added in an adder 114c. The added output and the output of ½ symbol rate delay 114a is multiplied in a multiplier 114d to then output a phase error (ek).

A phase error (ek) is converted into an analog signal in DAC 115 and is lowpass-filtered in a low-pass in lowpass filter 16. Then, voltage-controlled oscillator (VC) 117 supplies a clock required for DAC 103.

In other words, the signal passing through timing restoring portion 104 becomes a symmetric IF bandpass filtered signal of central 5.38 MHz. A zero crossing always occurs at a position of odd number times of T/2.

As described above, according to the the present invention, a symbol timing restoration is done well even if there is an NTSC identical channel interference, by improving a symbol timing restoring circuit. Also, based on the improved symbol timing restoring circuit, a post-comb filter can be eliminated, which considerably simplifies the overall circuit configuration.

What is claimed is:

1. A HDTV receiver comprising:

a tuner for selecting a necessary channel from input signals via an antenna;

an IF processing & carrier restoring portion for performing an IF process & carrier restoration from the output of said tuner;

an analog-to-digital converter (ADC) for converting the output of said IF processing & carrier restoring portion into a digital signal;

a timing restoring portion for restoring said timing from the output of said ADC; a 2:1 down-sampler for 2:1 down-sampling the output of said ADC;

a sync detector for detecting a sync from the output of the 2:1 down-sampler;

a channel equalizer for performing a channel equalization from the output of the 2:1 down-sampler;

a phase controller for correcting the phase error from the output of the channel equalizer;

an optimal viterbi decoder for performing a viterbi decoding operation from the output of said phase controller;

a deinterleaver for dissipating the output of said optimal viterbi decoder in order to enhance the correction capability due to burst errors;

an error controller for performing a Reed-Solomon decoding operation with respect to the output of said deinterleaver; and a derandomizer for releasing the output of said error controller and restoring a signal randomly formed at a transmission port reversely.

2. A HDTV receiver as claim 1, where said timing restoring portion comprises:

an FIR filter for filtering only the signal of a necessary symbol rate among the signals passing through said ADC;

a phase error detector for detecting an phase error (ek) from the output of said FIR filter;

a digital-to-analog converter (DAC) for converting again the output of said phase error detector into an analog signal;

a lowpass filter for lowpass-filtering the output of said DAC; and a voltage controlled oscillator for varying an oscillated frequency according to the output of said lowpass filter to supply a signal required in said ADC.

3. A HDTV receiver as claim 1, where said phase error detector comprises:

first and second ½ symbol rate delays for delaying the output of said FIR filter by ½ symbol rate;

an adder for adding the outputs of said second ½ symbol rate delay; and a multiplier for multiplying the output of said adder with the output of said first ½ symbol rate delay to output a phase error (ek).

\* \* \* \* \*